United States Patent [19]
Willingham et al.

[11] Patent Number: 5,952,853
[45] Date of Patent: Sep. 14, 1999

[54] METHOD FOR EXTENDING THE OUTPUT RANGE OF PULSE-WIDTH BASED PHASE DETECTORS

[75] Inventors: Scott D. Willingham, Sunnyvale; William J. McFarland, Los Altos, both of Calif.

[73] Assignee: Hewlett-Packard Company, Palo Alto, Calif.

[21] Appl. No.: 08/997,148

[22] Filed: Dec. 23, 1997

[51] Int. Cl.$^6$ .................................................... G01R 25/00
[52] U.S. Cl. ................................. 327/8; 327/235; 327/163
[58] Field of Search ........................... 327/8, 7, 12, 244, 327/169, 231, 233, 235, 236; 331/12

[56] References Cited

U.S. PATENT DOCUMENTS

| | | | |
|---|---|---|---|
| 4,520,321 | 5/1985 | Nakatsugwa | 327/12 |
| 4,767,945 | 8/1988 | Quinn | 327/412 |
| 4,868,512 | 9/1989 | Bridgeman | 327/12 |
| 5,307,020 | 4/1994 | Marcuard | 327/7 |
| 5,451,894 | 9/1995 | Guo | 327/241 |
| 5,491,673 | 2/1996 | Okayasu | 327/158 |
| 5,841,035 | 11/1998 | Andoh et al. | 73/861.22 |

*Primary Examiner*—Kenneth B. Wells
*Assistant Examiner*—Minh Nguyen

[57] ABSTRACT

A circuit for generating a signal that is proportional to the phase difference between a reference signal and a variable frequency signal. The circuit includes a reference generating circuit for generating N phase shifted reference signals from the reference signal. Each of the phase shifted reference signals has the same frequency and a different phase. The phase of the $n^{th}$ one of the phase shifted reference signals is equal to 360n/N degrees, where N>1 and n runs from 0 to N−1. A phase detection circuit generates a phase output signal proportional to the phase difference between the variable frequency signal and the phase shifted reference signal currently being outputted by the reference generating circuit. The phase output signal has value of I when the output signal corresponds to a phase difference of 360/N degrees. An overflow detection circuit determines when the phase output signal has an absolute value greater than I and generates a count signal and a phase adjustment signal when this situation is detected. The phase adjustment signal is coupled to the reference generating circuit and causes the reference generating circuit to select a new phase shifted reference signal. A counter is then incremented/decremented to track the accumulated phase adjustments. A digital to analog converter converts the digital value in the counter to a signal having an amplitude equal to MI, where M is the digital value. A sum circuit adds this signal to the phase output signal.

5 Claims, 6 Drawing Sheets

METHOD FOR EXTENDING THE OUTPUT RANGE OF PULSE-WIDTH BASED PHASE DETECTORS

FIELD OF THE INVENTION

The present invention relates to electronic circuits, and more particularly, to circuits for measuring the phase difference between two signals.

BACKGROUND OF THE INVENTION

A number of circuits utilize phase detection circuits for measuring the phase difference of two signals. For example, frequency synthesizers based on phase locked loops are well known in the electronic arts. These circuits generate a signal which is a multiple of a reference frequency. The circuits utilize a feedback system in which the output signal's frequency is divided by X and fed to a phase detector which generates a signal indicative of the phase difference between the frequency divided output signal and the reference signal. This signal is then used to servo a voltage controlled oscillator until the output signal generated by the voltage controlled oscillator is X times the reference frequency.

Consider the case in which the two signals whose phase difference is to be determined differ substantially in frequency. The phase difference of these signals will increase linearly with time. Unfortunately, prior art phase detection circuits are not capable of measuring an arbitrarily large phase difference. The typical phase detection circuit generates a signal that is linearly related to the phase difference until the phase difference exceeds some predetermined value, usually about 360 degrees. As the phase increases past this value, the output signal returns to zero and starts to increase again. In effect, the output of these phase detectors is roughly proportional to the phase difference modulo 360 degrees.

The lack of linearity in the phase detection circuit has a deliterious effect on the settling time of a phase lock loop frequency synthesizer. To accommodate the range limitation associated with the output signal returning to zero at multiples of 360 degrees, an integrator must be included in the phase locked loop. The integrator and associated stabilizing components introduce time constants which increase the settling time of the loop when the output frequency is changed or the synthesizer is first turned on. In addition, the non-linearities in the phase detector also result in poor settling times when the output frequency differs greatly from the desired frequency, since the servo signal generated by a 370 degree phase difference is the same as that generated by a 10 degree phase difference.

Circuits that eliminate the "wrapping" of the phase difference signal at 360 degrees have been utilized to improve the performance of phase locked loops. These circuits generate a signal that is linearly related to the phase difference when the input signals are close in frequency. When the signals differ substantially in frequency, however, the output signal is a non-linear function of the frequency difference of the signals. Unfortunately, the non-linear relationship between the phase difference and the output signal present in these circuits also results in a significant increase in the settling time of a phase locked loop utilizing such circuits relative to the settling time that would be obtained if a linear phase detector had been utilized.

Broadly, it is the object of the present invention to provide an improved phase detection circuit.

It is a further object of the present invention to provide a phase detection circuit whose output is linearly related to the phase difference of the input signals even when the phase difference exceeds 360 degrees.

These and other objects of the present invention will become apparent to those skilled in the art from the following detailed description of the invention and the accompanying drawings.

SUMMARY OF THE INVENTION

The present invention is a circuit for generating a signal that is proportional to the phase difference between a reference signal and a variable frequency signal. The circuit includes a reference generating circuit for generating N phase shifted reference signals from the reference signal. Each of the phase shifted reference signals has the same frequency and a different phase. The phase of the $n^{th}$ one of the phase shifted reference signals is equal to $360n/N$ degrees, where $N>1$ and n runs from 0 to $N-1$. The reference generating circuit outputs one of the phase shifted reference signals at any given time. A phase detection circuit, connected to the reference generating circuit, generates a phase output signal proportional to the phase difference between the variable frequency signal and the current phase shifted reference signal. The phase output signal has value of I when the output signal corresponds to a phase difference of $360/N$ degrees. An overflow detection circuit determines when the phase output signal has an absolute value greater than I. The overflow detection circuit generates a count signal and a phase adjustment signal when this situation is detected. The phase adjustment signal is coupled to the reference generating circuit and causes the reference generating circuit to output a new reference signal. A counter, coupled to the overflow detection circuit, holds a digital value which is incremented or decremented in response to the count signal. A digital to analog converter converts the digital value in the counter to a signal having an amplitude equal to MI, where M is the digital value. A sum circuit adds the signal generated by the digital to analog converter to the phase output signal.

DETAILED DESCRIPTION OF THE INVENTION

The present invention is based on two observations. First, linear phase detection circuits for phase differences of less than 360 degrees are known and operate adequately. Second, any phase difference may be represented as a multiple of a predetermined phase difference less than 360 degrees plus a residual phase difference which is less than 360 degrees.

Figure 1:
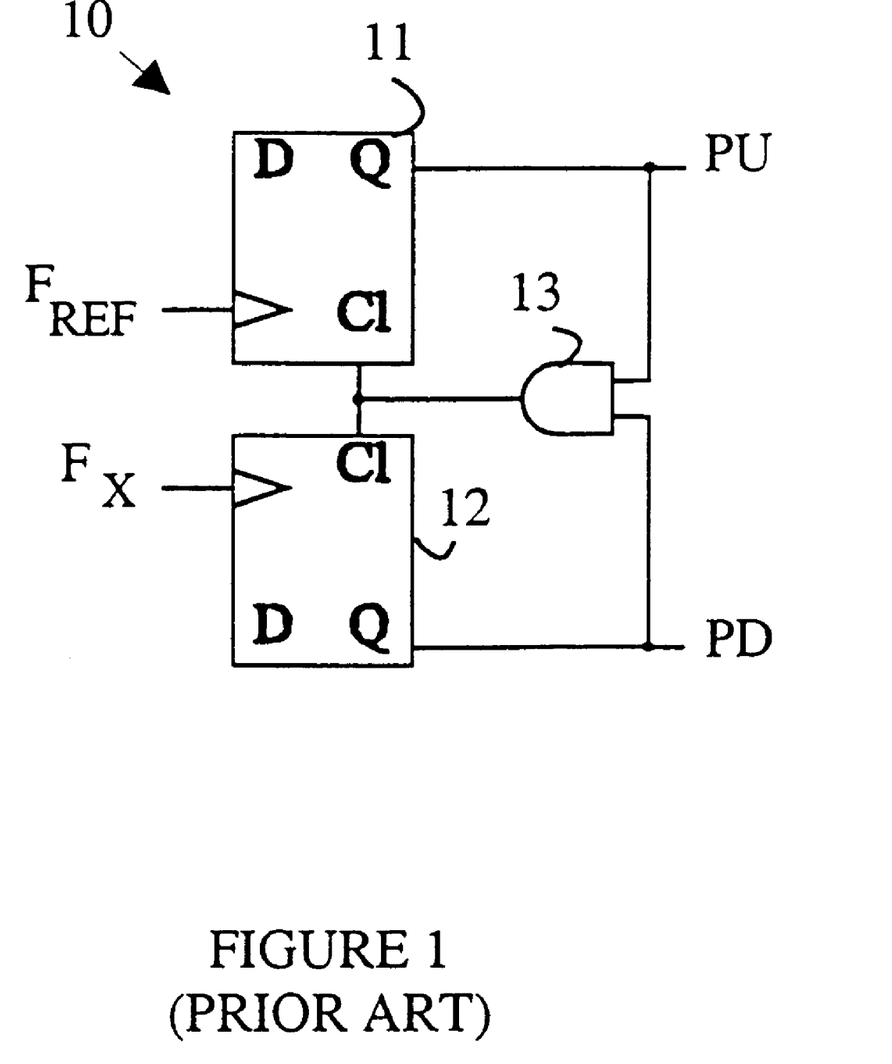
FIG. 1 is a schematic drawing of a circuit for measuring a phase difference between two signals.

Refer now to FIG. 1 which illustrates the manner in which a phase detector for measuring a phase difference of less than 360 degrees operates. Phase detector 10 generates two signals, PU and PD. Each of these signals has a pulse width that is proportional to the phase difference between $F_{ref}$ and $F_x$ over the range of phase differences discussed below. If the reference signal leads $F_x$, PU represents the phase difference. If reference signal lags $F_x$, PD represents the phase difference.

Consider the case in which $F_{ref}$ leads $F_x$. The leading edge of $F_{ref}$ sets flip-flop 11 causing PU to go high. PU will remain high until the next leading edge of $F_x$ causes flip-flop 12 to bring PD high which resets both flip-flops via gate 13. If $F_{ref}$ lags $F_x$, then there will be a cycle in which the leading edge of $F_x$ arrives at flip-flop 12 when both flip-flops are reset causing PD to go high. The next leading edge of $F_{ref}$ then resets the flip flops.

During certain time periods that depend on the difference in frequencies between the two inputs, the pulse width of the PU or PD signal is proportional to the phase difference between $F_{ref}$ and $F_x$. Outside of this range, the outputs will no longer be proportional to the total phase differences. For example, if $F_{ref}$ is much higher than $F_x$, then a second leading edge of $F_{ref}$ can arrive at flip-flop 11 before a leading edge of $F_x$ resets the phase detector. For any given maximum difference in frequencies, there will always be a range of times over which the PU and PD signals are proportional to the phase difference.

The present invention makes use of this linear range by adjusting the phase of $F_{ref}$ periodically such that the phase difference between $F_{ref}$ and $F_x$ is always within the linear range of the phase detector. The accumulated phase adjustment is stored in a register that is used to generate a current representing the accumulated phase adjustment. The output of the phase detector is also converted to a current which is proportional to the pulse width of the PU or PD signals. These two currents are then added to obtain a current that is proportional to the total phase difference between the two signals.

Figure 2:
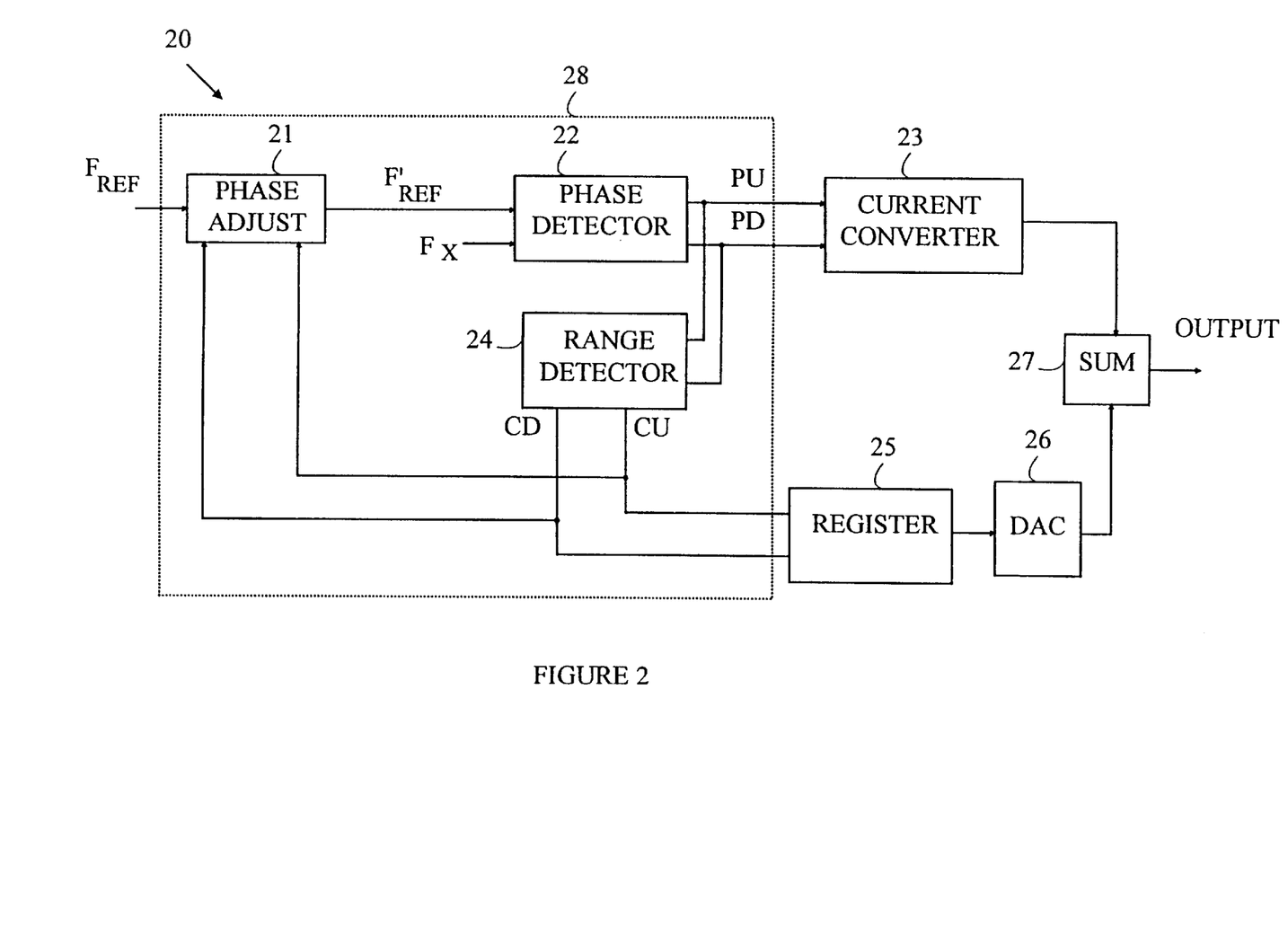
FIG. 2 is a schematic drawing of a phase measuring circuit according to the present invention.

The manner in which the present invention operates may be more easily understood with reference to FIG. 2 which is a block diagram of a phase measuring circuit 20 according to the present invention. Circuit 20 generates an output signal which is proportional to the phase difference between a reference signal $F_{ref}$ and a signal $F_x$ whose phase and frequency is assumed to be variable. Phase detector 22 measures the phase difference between an adjusted reference signal $F'_{ref}$ and $F_x$ in a manner analogous to phase detector 10 discussed above.

The adjusted reference signal is generated by adding or subtracting predetermined phase increments to $F_{ref}$ using phase adjustment circuit 21. The manner in which phase adjustment circuit 21 operates will be explained in more detail below. For the purposes of the present invention discussion, it will be assumed that the phase increments are 360/N degrees, and hence, phase adjustment circuit 21 selects one of the N signals generated by adding 360n/N to $F_{ref}$. Here n runs from 0 to N−1.

An overflow detection circuit 24 monitors the output of phase detector 22 to determine if the phase difference between $F'_{ref}$ and $F_x$ has an absolute value greater than 360/N. If overflow detector 24 detects a phase difference that is outside of this range, it generates a signal, CU or CD, which indicates this condition and whether the phase difference is less than −360/N (i.e., CU) or greater than +360/N (i.e., CD). CU causes register 25 to be incremented and phase adjust circuit 21 to subtract 360/N from the phase of $F'_{ref}$. Similarly, CD causes register 25 to be decremented and 360/N to be added to the phase of $F'_{ref}$.

The output of phase measuring circuit 20 is generated by a sum circuit 27 which adds the phase difference detected by phase detector 22 to a current which is proportional to the count in register 25. A current converter 23 converts the pulse width of the PU and PD to an average current in a range from −I to I. Similarly, digital to analog converter 26 converts the count in register 25 to current equal to MI, where M is the count stored in register 25. It should be noted that M may be negative. Alternatively, the output of the analog to digital converter can be offset by a fixed current, thereby allowing only positive M values to be used. The later alternative has the advantage of not requiring a bi-polar analog to digital converter.

The present invention will be discussed in terms of embodiments in which the phase difference is held between −I and I. However, it will be apparent to those skilled in the art from the following discussion that embodiments in which the phase difference is held between any two values separated by 2I may also be constructed. Such embodiments are equivalent to offsetting the phase of the reference signal by a constant value. Since the "zero" phase of the reference signal is arbitrary, such an offset does not change the operation of the invention.

Figure 3:
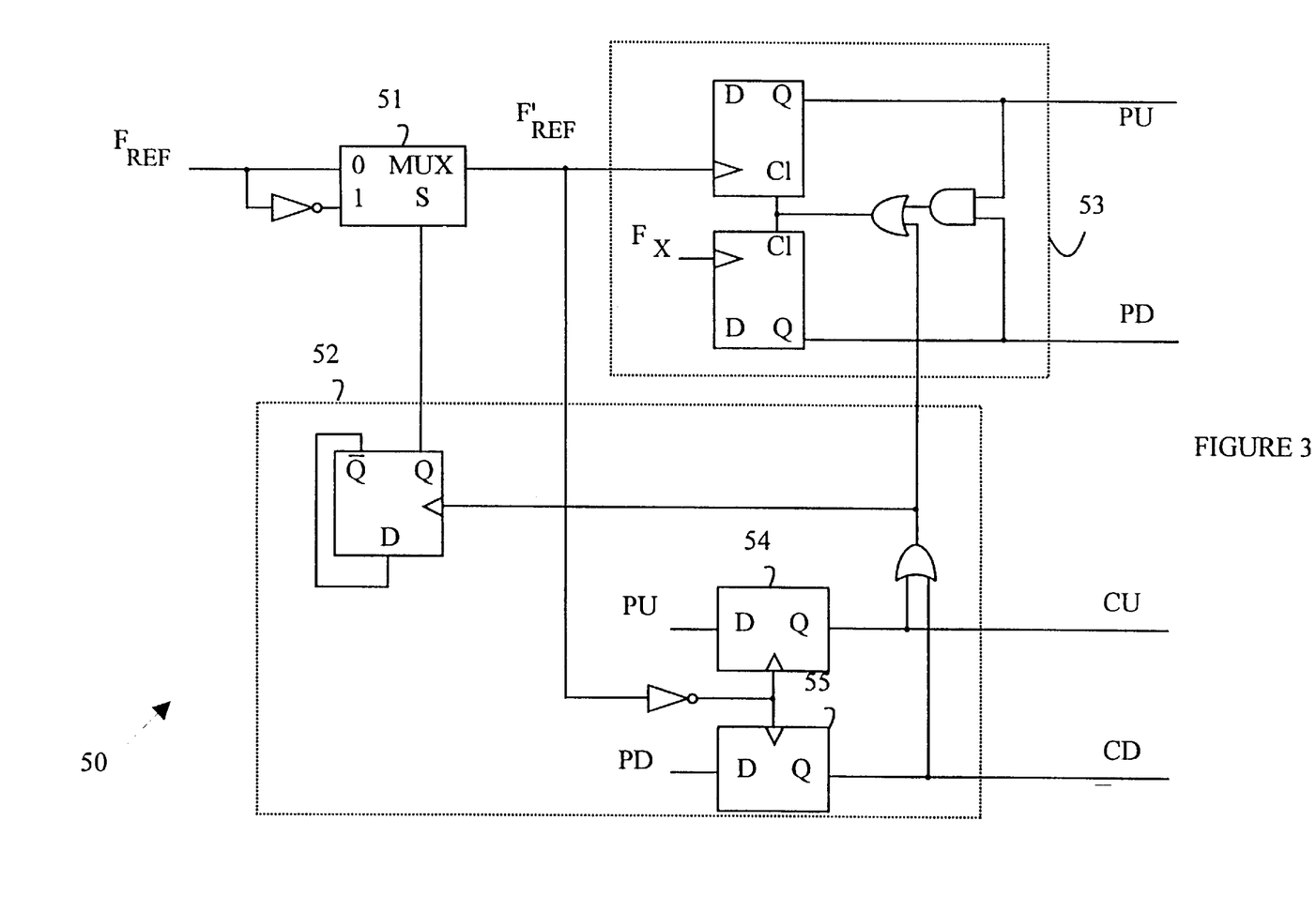
FIG. 3 is a schematic drawing of a phase tracking circuit according to the present invention for the case in which $N=2$.

The present invention will now be discussed in terms of embodiments in which N=2. Refer to FIG. 3 which is a schematic drawing of a phase tracking circuit 50 which performs the functions of the circuitry shown at 28 in FIG. 2. Since N=2, the phase adjusting circuit need only choose between the reference signal $F_{ref}$ and this signal phase shifted by 180 degrees. For the purposes of this example, it is assumed that the reference signal has a 50% duty cycle, and hence, the reference signal shifted by 180 degrees is merely the complement of the reference signal. Accordingly, the phase adjusting circuit 21 shown in FIG. 2 can be implemented with a simple multiplexer shown at 51 which selects between the reference signal and the complement of this signal to generate the modified reference signal $F'_{ref}$.

The function provided by phase detector 22 shown in FIG. 2 is provided by a phase detector circuit 53 which operates in a manner analogous to the circuit shown in FIG. 1. When $F_x$ lags in phase relative to $F'_{ref}$, a signal PU is generated having a pulse width that is proportional to the phase difference. When $F_x$ leads $F'_{ref}$, a signal PD is generated having a pulse width that is proportional to the phase difference.

Overflow circuit 52 monitors the pulse width of PU and PD to determine if the phase difference between $F_x$ and $F'_{ref}$ exceeds 180 degrees. When circuit 52 detects a phase difference in excess of 180 degrees it generates CU or CD, depending on whether the phase difference is positive or negative, and then toggles multiplexer 51. Consider the case in which the phase difference is negative, i.e., PU is active, having a pulse width which is proportional to the phase difference. Flip-flop 54 samples the PU signal on the falling edge of $F'_{ref}$. If the phase difference is greater than 180 degrees, PU will still be high on the falling edge of $F'_{ref}$. Hence, the output of flip-flop 54 will go high, and CU will also be generated. CU will cause the multiplexer 51 to switch to the alternative signal for $F'_{ref}$, thereby changing the phase of $F'_{ref}$ by 180 degrees. This will reduce the pulse width of PU, thereby returning it to a value less corresponding to a phase difference of less than 180 degrees. Flip-flop 55 performs the analogous comparison when PD is active, i.e., $F'_{ref}$ lags $F_x$.

Figure 4:
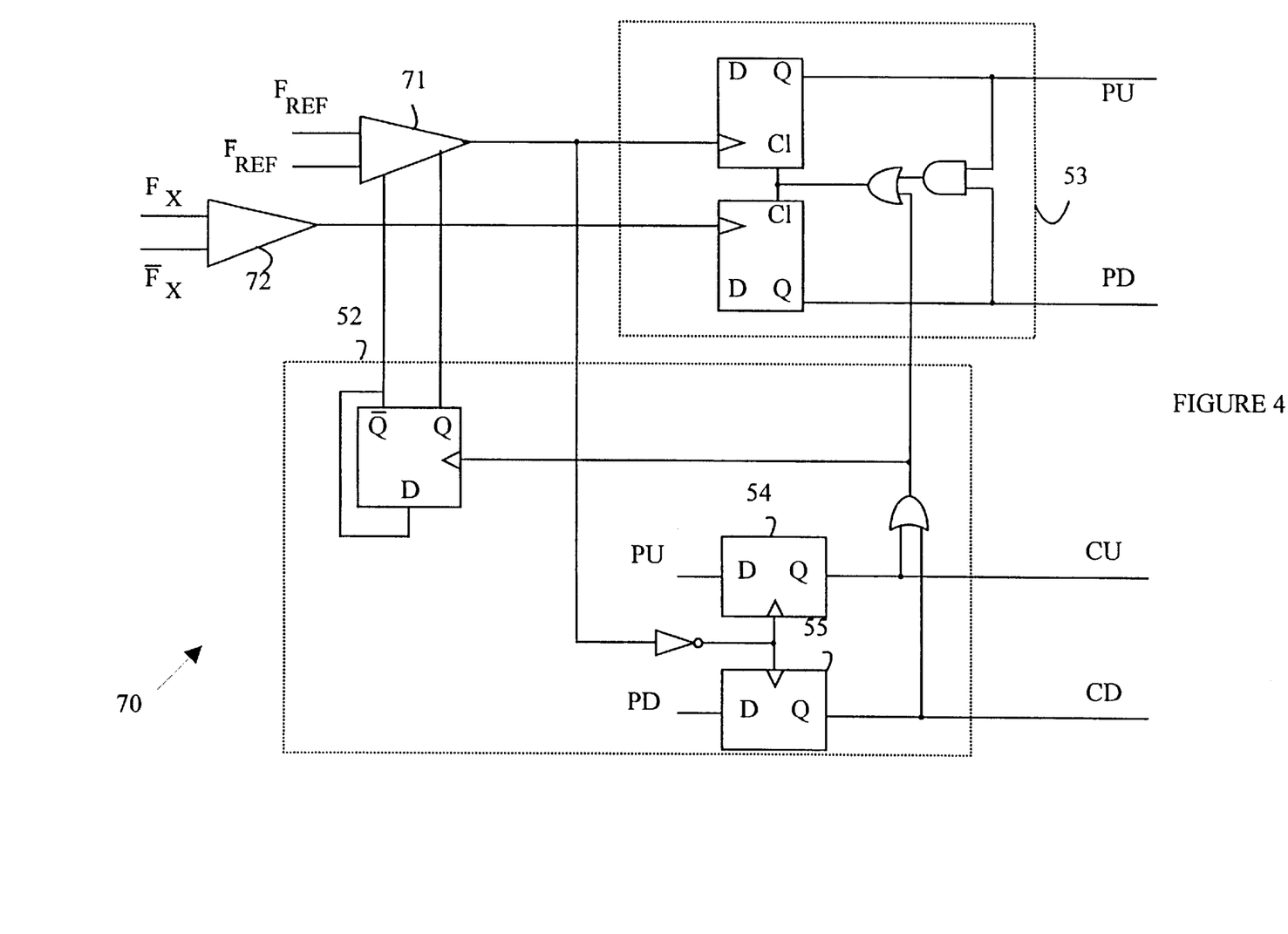
FIG. 4 is a schematic drawing of a phase tracking circuit which may be utilized with sine waves.

The embodiment shown in FIG. 3 assumes that the input signals are essentially square waves. Refer now to FIG. 4 which is a schematic diagram of a phase tracking circuit 70 which may be utilized with sine waves. Phase tracking circuit 70 differs from circuit 50 in that preamplifiers shown at 71 and 72 are used to convert the signals to square waves. In addition, the preamplifiers are run in a differential mode to reduce noise interference. Finally, the multiplexing function has been incorporated in preamplifier 71. The use of preamplifiers for both the reference and variable signal preserves the symmetry of the circuit which improves the accuracy of the phase measurements.

While the phase tracking circuits described above will operate satisfactorily, there is a small problem in the cases in which the phase difference is very close to 180 degrees. In this case, both CU and CD may be asserted simultaneously. The problem arises from the fact that the PU and PD are both asserted near the trailing edge of a PU cycle, prior to flip-flop resets.

Figure 5:
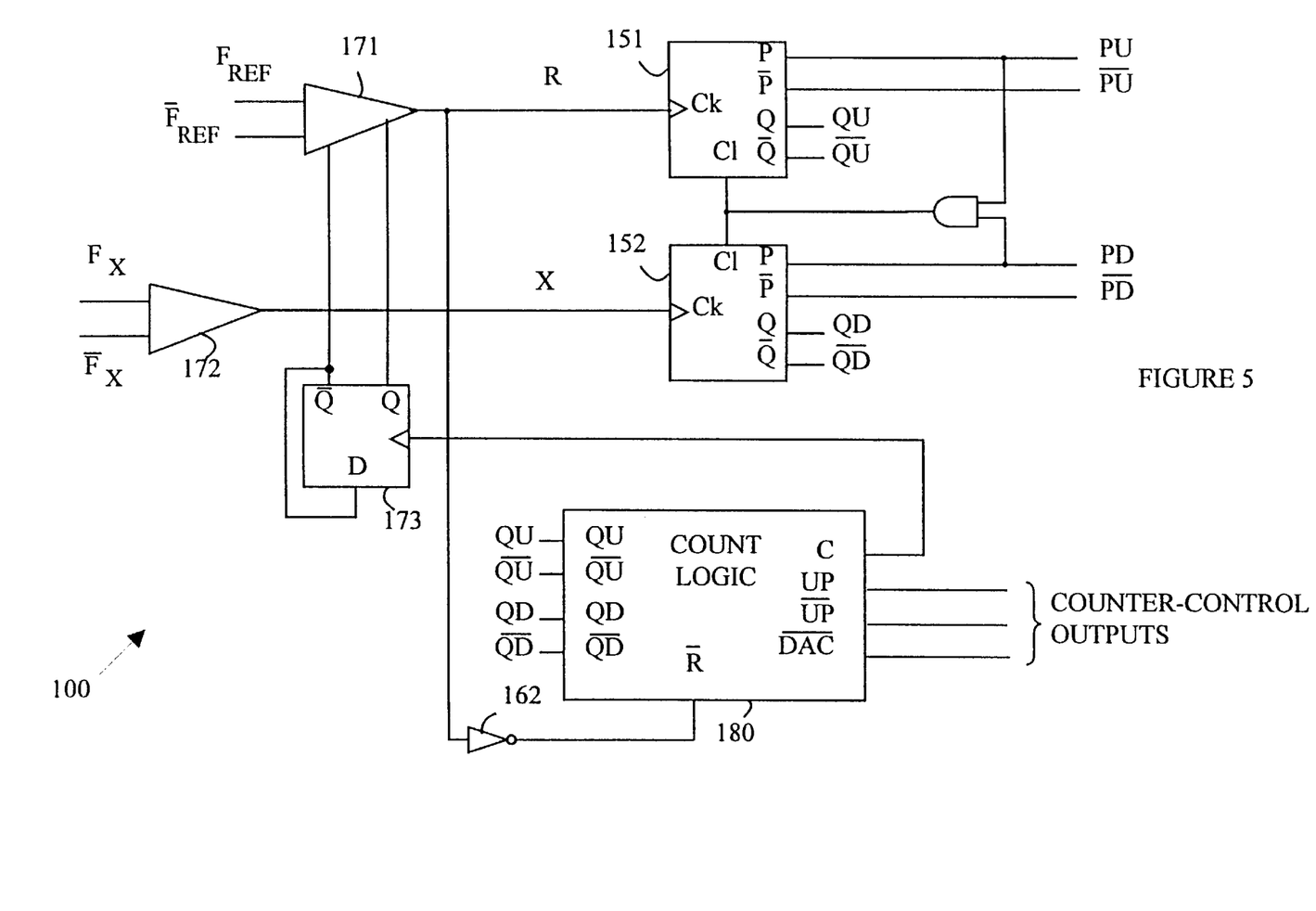
FIG. 5 is a schematic drawing of another embodiment of a phase tracking circuit according to the present invention.

A schematic diagram of an embodiment of the present invention which avoids this problem is shown at 100 in FIG. 5. Phase tracking circuit 100 assumes that $F_{ref}$ and $F_x$ are sinusoids. These signals are amplified to sharp logic levels by differential-input preamplifiers 171 and 172, respectively. Preamplifiers 171 and 172 have selectable polarity. The selectable polarity of preamplifier 171 is used to change the phase of the reference signal R by 180 degrees when either PU or PD exceeds a phase shift of 180 degrees. Preamplifier 172 is implemented with an identical preamplifier to improve the accuracy of phase tracking circuit 171; however, the selectable polarity feature of preamplifier 172 is not utilized.

The logic signals R and X are used to drive flip-flops 151 and 152 which generate two sets of output signals. The signals PU and PD have pulse widths that are proportional to the phase difference between $F_{ref}$ and $F_x$. The logically similar signals QU and QD are used to detect the cases in which one of these signals represents a phase difference of greater than 180 degrees. Signals PU and $\overline{PU}$ are overlapping-low, i.e., when PU goes low, $\overline{PU}$ remains low until PU finishes its transition. Signals QU and $\overline{QU}$ are overlapping-high.

The counting logic 180 differs from the embodiments shown above in that the signals CU and CD have been replaced by a count signal C and a direction signal UP which indicates whether the counter is to be incremented or decremented. The count signal drives flip-flop 173 which controls the phase of R.

Figure 6:
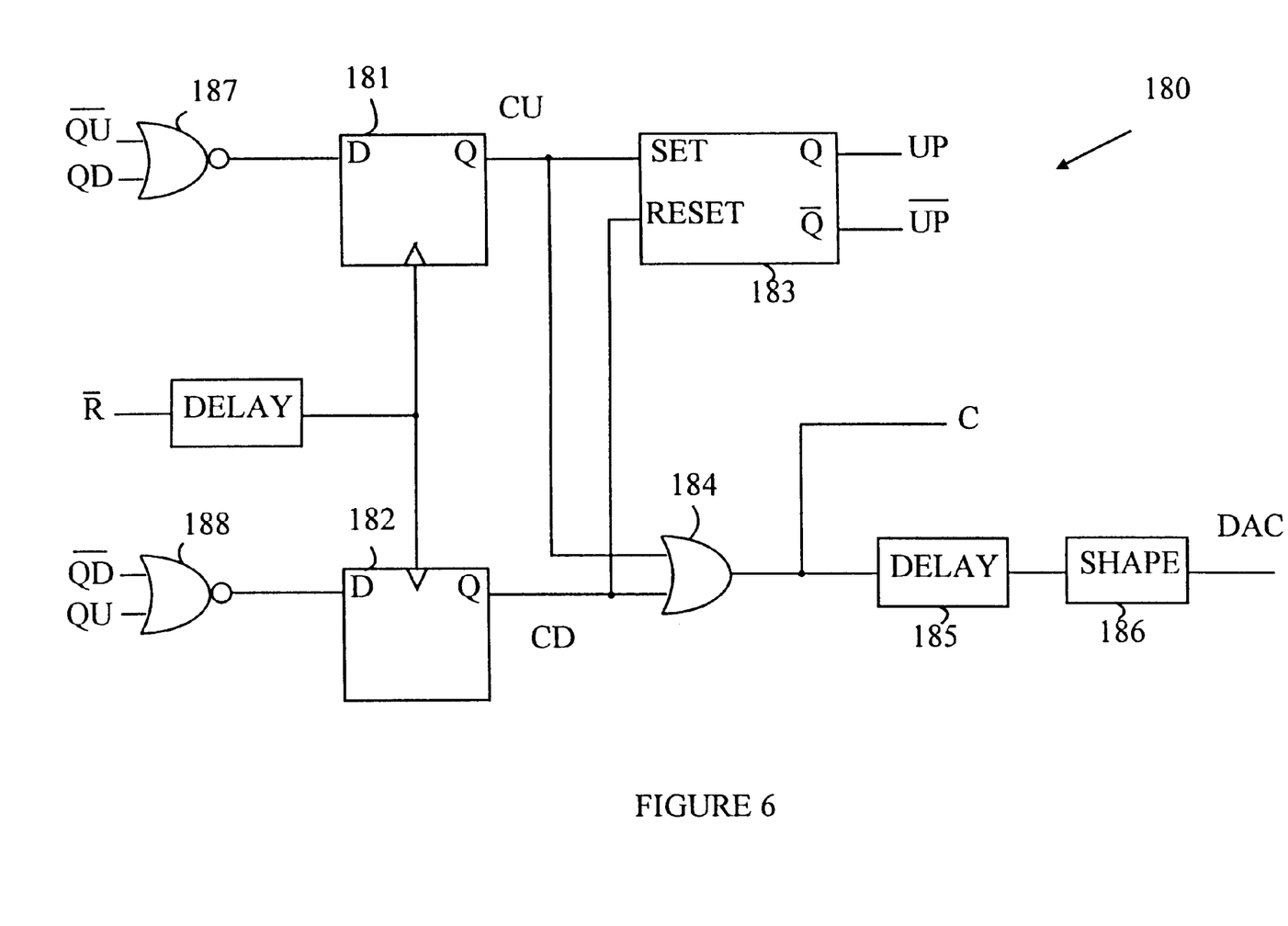
FIG. 6 is a schematic drawing of the counting logic shown in FIG. 5.

The counting logic is shown in more detail in FIG. 6. The detection of a phase shift greater than 180 degrees is performed by flip-flops 181 and 182 which operate in a manner analogous to that discussed above with reference to flip-flops 54 and 55. These flip-flops are driven with signals derived from the QU and QD signals by NOR gates 187 and 188 to prevent CU and CD from being asserted simultaneously when the phase difference between R and X is near 180 degrees. The CU and CD signals are converted to the C and UP signals discussed above by latch 183 and gate 184. A second count signal, DAC, is formed from C by utilizing delay circuit 185 and pulse shaping circuit 186. DAC is used to strobe the counter. The delay and pulse lengthening assure that the signal is not asserted until UP has settled and that the signal is of sufficient duration to properly increment the counter.

In those cases in which N>2 the various phase shifted reference signals may be generated by a frequency dividing a higher frequency reference signal. A multiplexer then selects between the N phase shifted reference such that each time the phase signal from the phase measuring circuit moves outside of the ±360/N degree range, the next higher or lower phase reference signal is selected for input to the phase measuring circuit.

The above described embodiments of the present invention utilize a phase detection circuit that provides a signal that is proportional to the phase difference between the phase shifted reference signal and the variable frequency signal. However, it will be apparent to those skilled in the art from the preceding discussion that strict proportionality is not required. So long as the output of the phase detection circuit is monotonically related to the phase difference and the points at which the absolute value of the phase difference exceeds 360/N are detectable, a workable system can be constructed. In such a system, any non-linearities can be corrected by providing a calibration circuit as part of current converter 23 shown in FIG. 2. Furthermore, if N is sufficiently large, the current converter can be eliminated in systems which do not require an accuracy of more than 360/N .

Various modifications to the present invention will become apparent to those skilled in the art from the foregoing description and accompanying drawings. Accordingly, the present invention is to be limited solely by the scope of the following claims.

What is claimed is:

1. A circuit for generating a signal indicative of the phase difference between a reference signal and a variable frequency signal, said circuit comprising:

a reference generating circuit for generating a phase reference signal having N phase shifted states from said reference signal, each of said phase shifted states having the same frequency and a different phase, the phase of the $n^{th}$ one of said phase shifted states being equal to 360n/N degrees, where N>1 and n runs from 0 to N−1, said reference generating circuit outputting one of said phase shifted states as a phase shifted reference signal;

a phase detection circuit, connected to said reference generating circuit and receiving said phase shifted reference signal, for generating a phase output signal monotonically related to the phase difference between said variable frequency signal and said received phase shifted reference signal, said phase output signal having a value of I when said output signal corresponds to a phase difference of 360/N degrees;

an overflow detection circuit for determining when said phase output signal has an absolute value greater than I, and for generating a count signal and a phase adjustment signal in response thereto, said phase adjustment signal being coupled to said reference generating circuit and causing said reference generating circuit to output a new phase shifted reference signal; and a counter coupled to said overflow detection circuit for holding a digital value, said digital value being incremented or decremented by said count signal.

2. The circuit of claim 1 further comprising:

a digital to analog converter for converting said digital value in said counter to a signal having an amplitude equal to MI, where M is said digital value; and a sum circuit for adding said signal generated by said digital to analog converter to a signal derived from said phase output signal.

3. The circuit of claim 1 wherein said reference generating circuit comprises a multiplexer for selecting either said reference signal or the complement of said reference signal.

4. The circuit of claim 1 wherein said reference signal and said variable frequency signal are sinusoidal and where said circuit further comprises a first amplifier for amplifying said reference signal to logic levels and a second amplifier for amplifying said variable signal to logic levels.

5. The circuit of claim 4 wherein said first amplifier is a differential amplifier having said reference signal and the complement thereof as inputs and having selectable polarity, and wherein reference generating circuit comprises a circuit for switching said polarity in response to said overflow detection circuit determining that said phase output signal has an absolute value greater than I.

* * * * *